VARIABLE FREQUENCY TRANSISTORIZED RF AMPLIFIER
WITH AMPLITUDE COMPENSATED OUTPUT
Filed Sept. 21, 1964
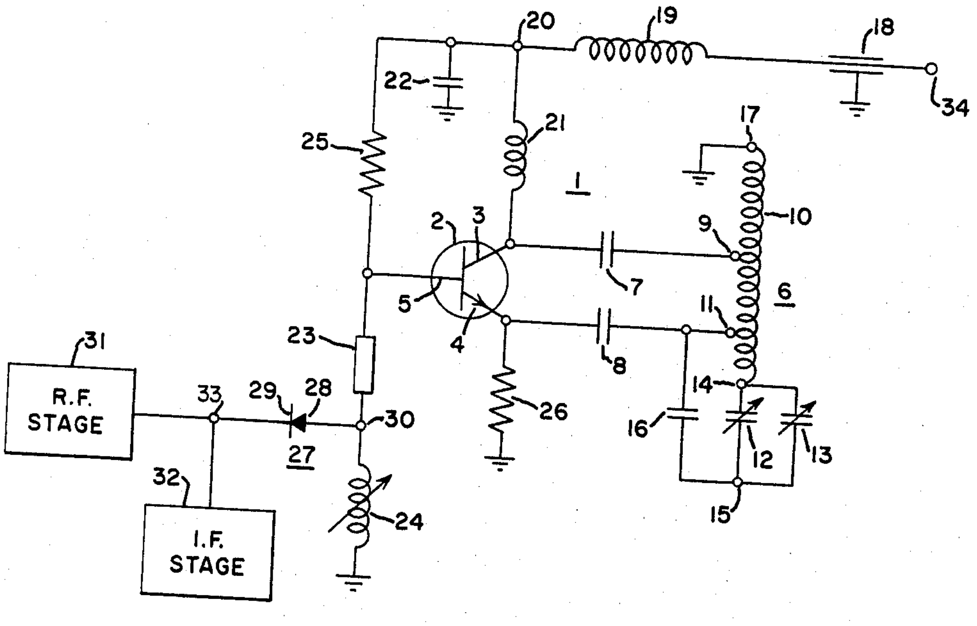
INVENTOR:
SANJAR GHAEM-MAGHAMI,
BY William S. Wolfe
HIS ATTORNEY.

United States Patent Office 3,408,576

Patented Oct. 29, 1968

3,408,576

VARIABLE FREQUENCY TRANSISTORIZED RF AMPLIFIER WITH AMPLITUDE COMPENSATED OUTPUT

Sanjar Ghaem-Maghami, Liverpool, N.Y., assignor to General Electric Company, a corporation of New York Filed Sept. 21, 1964, Ser. No. 397,822
11 Claims. (Cl. 325—439)

ABSTRACT OF THE DISCLOSURE

An adjustable LC network is connected between the collector and base electrodes of a transistor to permit frequency variation in a UHF transistor oscillator. The base electrode of the transistor is connected to a biasing resistor and a series frequency sensitive voltage dividing impedance. A first element of the voltage dividing impedance comprises a carbon resistor with inherent capacitive reactance and a second element of the voltage dividing impedance comprises an inductor with a low resistance. Utilization circuitry including a mixer diode for RF conversion is connected to the junction point between the carbon resistor and inductor.

This invention relates to an improvement in a transistor oscillator. More specifically, this invention relates to circuitry for deriving an output signal from the oscillator.

Conventional transistor oscillators, such as those used in a frequency range including about 250 mc. to about 1000 mc., experience a change in the magnitude of the output signal with a change in the frequency of oscillation due to inherent characteristics of these oscillators, such as inter-electrode capacitance of transistors and lead inductance. For example, local oscillators used in frequency converters for communications receivers experience a decrease in the magnitude of an output signal with an increase in the frequency of the oscillator. My invention is concerned with circuitry which tends to compensate for the above-mentioned change in the output signal of a transistor oscillator.

Accordingly, it is an object of my invention to provide an improved oscillator having circuitry which tends to compensate for a change in the magnitude of the output voltage of the oscillator caused by a change in the frequency of oscillation.

It is another object of my invention to use components of the above-mentioned circuitry in a bias circuit for a transistor of the oscillator, thereby reducing the cost of manufacturing the oscillator or of a device in which it is used.

It is another object of my invention to provide circuitry which couples an output signal from a transistor oscillator in a manner which overcomes the above-mentioned deficiencies of the prior art and enables circuitry associated therewith to be more inexpensively manufactured.

Briefly stated, in accordance with one aspect of my invention, I use a frequency sensitive voltage dividing impedance means connected to one electrode of an oscillator transistor to derive an output signal from the oscillator and to couple a signal, comprising a fraction of this output signal, to associated circuitry. The reactance of the voltage dividing impedance means changes with the frequency of the oscillator in such a manner that the voltage dividing impedance means tends to compensate the signal coupled therefrom, for changes in the magnitude of the output signal derived from the oscillator. For example, as the output signal decreases in magnitude, a larger fraction thereof is coupled by the voltage dividing impedance means to the associated circuitry. This tends to keep the signal coupled from the impedance means substantially constant in magnitude.

The single drawing is a circuit diagram illustrating one embodiment of my invention as applied to a high frequency converter for a communications receiver.

The oscillator 1 of this invention comprises a transistor 2 having three electrodes, a collector electrode 3, an emitter electrode 4, and a base electrode 5. An adjustable means comprising a tank circuit 6 is connected between the collector 3 and the emitter 4 of transistor 2 to produce an oscillatory sustaining condition in a frequency range including about 250 mc. to about 1000 mc. The tank circuit 6 is coupled by capacitors 7 and 8, respectively, to the collector 3 and to the emitter 4. The capacitor 7 is connected to a point 9 on an inductor 10 of the tank circuit 6, while the capacitor 8 is connected to a point 11 on the inductor 10. Variable capacitors 12 and 13 of the tank circuit 6 are connected in parallel between a terminal 14 of the inductor 10 and a terminal 15. A last capacitor 16 of the tank circuit 6 is connected between the point 11 and the terminal 15. The inductor 10 is grounded at a terminal 17.

A source of direct current operating potential is coupled from a power source through terminal 34, a radio frequency filter 18, an inductor 19, a junction point 20, and an inductor 21 to the collector 3 of the transistor 2. A radio frequency filtering capacitor 22 is connected between the junction point 20 and ground. The inductor 21 isolates radio frequency signals from ground, while the inductor 19 isolates radio frequency signals from the power supply.

A frequency sensitive voltage dividing impedance means, comprising an impedance element 23 and a variable inductor 24, is coupled between the base electrode 5 at a first terminal thereof and ground at a second terminal thereof. The impedance element 23 is an impedance device having resistive characteristics and having capacitively reactive characteristics over a frequency range including about 250 mc. to about 1000 mc. One example of such a device is a 3000 ohm, one-half watt carbon resistor having one-quarter inch leads which has a capacitance value of from 3 to 4 picofarads measured at 250 mc. An example of inductor 24 is a coil comprising two inches #24 wire which has a low resistive impedance and a minimum inductance on the order of 0.03 $\mu h$.

A transistor biasing network includes a biasing resistor 25 connected between the junction point 20 and the base electrode 5, and an emitter resistor 26 connected between the emitter electrode 4 and ground. The biasing network further includes the impedance element 23 and the inductor 24, but only the resistance of the impedance element 23 is effectively included because the inductor 24 has a low resistive impedance.

A conductive means, comprising mixer diode 27 having an anode 28 and a cathode 29, is coupled at anode 28 to a third terminal or junction point 30 between the impedance element 23 and the inductor 24. Cathode 29 of the mixer diode 27 is connected to the radio frequency stage 31 and the intermediate frequency stage 32 at a junction point 33.

In operation, the tank circuit 6 produces the oscillation of the oscillator 1 in a manner well-known in the art. The frequency sensitive voltage dividing impedance means, comprising the impedance element 23 and the inductor 24, derives an output signal from the oscillator 1 at the base electrode 5 of the transistor 2. A signal is then coupled from the junction point 30 between the impedance element 23 and the inductor 24 to circuitry which utilizes the signal. In the example shown, the signal at junction point 30 is applied to the diode 27 and the stages 31 and 32 for utilization.

The inherent characteristics of an oscillator which oscillates in the above-mentioned frequency range cause the magnitude of the output signal to vary as the frequency of the oscillator changes.

In the present example, such factors as the inter-electrode capacitance and the inductance of the leads of the transistor 2 cause the magnitude of the output signal at the base 5 of the transistor 2 to change inversely with a change in the frequency of the oscillator 1. In order to maintain a signal coupled from the junction point 30 at a substantially constant magnitude over the frequency range of the oscillator 1, the voltage dividing impedance means comprising impedance element 23 and inductor 24 compensates for the change in the output signal. The reactance $X_C$ of the impedance element 23 is $$X_c=\frac{1}{2\pi fc} \qquad (1)$$

and the reactance $X_L$ of the inductor 24 is $$X_L=2\pi fL \qquad (2)$$

As seen in these equations, the reactance $X_C$ of the impedance element 23 varies inversely with a change in the frequency of the output signal applied thereto. However, the impedance $X_L$ of the inductor 24 varies directly with the frequency of the output signal. The signal coupled from the junction point 30, $e_s$, is a fraction of the oscillator output signal, $e_o$, which is proportional to the magnitude of the reactance $X_L$ divided by the sum of the reactances $X_L$ and $X_C$.

$$e_s Z\left[\frac{X_L}{X_L+X_C}\right]e_o \qquad (3)$$

By substituting Equations 1 and 2 into Equation 3, $$e_s Z\left[\frac{(2\pi f)^2 LC}{(2\pi f)^2 LC+1}\right]e_o$$

Therefore, it is seen that the fraction of the output signal $e_o$ coupled from the junction point 30 varies directly in proportion with the change in the frequency of oscillation. This change in the fraction of the output signal coupled from the junction point 30, with the change in frequency, compensates for the change in the magnitude of the output signal, which is inverse with the change in frequency, as long as the term $(2\pi f)^2$ LC has a value which is not substantially greater than one or substantially less than one.

As may be seen in the drawing, the signal $e_s$ may be mixed with a radio frequency signal from the stage 31 by the diode 27 and fed to the stage 32 in a manner well-known in the art.

My invention is not limited to the embodiment shown herein or to the application of this improved oscillator to the communications art. To the contrary, my invention is capable of numerous modifications, and modifications, as recognized by those skilled in the art, without deviating from the scope thereof and should not be limited in any sense except as defined by the following claims.

What I claim is:

1. In a transistor oscillator having a transistor with three electrodes, an adjustable means connected between two of the three electrodes of the transistor to produce an oscillatory sustaining condition in a frequency range including about 250 mc. to about 1000 mc., the improvement comprising:

a frequency sensitive impedance means including first, second, and third terminals, the first of said terminals coupled to one of said three electrodes of said transistor, the second of said terminals coupled to a circuit point of substantially fixed potential, the reactance of said impedance means changing with a changing frequency of oscillation so as to produce simultaneously a signal at the first of said terminals having an amplitude changing with frequency and a signal at the third of said terminals having a relatively constant amplitude regardless of the changing frequency.

2. A transistor oscillator as recited in claim 1 wherein the third of said terminals is intermediate the first and the second of said terminals.

3. A transistor oscillator according to claim 2 wherein said impedance means includes an impedance element which is effectively included in a biasing circuit for said transistor.

4. A transistor oscillator according to claim 2 wherein said impedance means includes a first impedance element having capacitively reactive characteristics over said frequency range.

5. A transistor oscillator according to claim 2 wherein said impedance means includes a first impedance element having resistive characteristics between the first of said terminals and the second of said terminals and having capacitively reactive characteristics over said frequency range, and an inductive impedance device in series with said first impedance element between the second of said terminals and said circuit point.

6. A transistor oscillator according to claim 5 wherein said first impedance element is effectively included in a biasing circuit for said transistor.

7. In a transistor oscillator having a transistor; an adjustable tank circuit connected between the collector and emitter electrodes of the transistor to produce an oscillatory sustaining condition in a frequency range including about 250 mc. to about 1000 mc.; a transistor biasing circuit including an emitter resistor, a transistor biasing network connected to a source of direct current biasing potential and connected to the base electrode of said transistor; the improvement comprising: a frequency sensitive voltage dividing impedance means connected between the base electrode of said transistor and ground for deriving an output signal therefrom; said impedance means including a first impedance element having resistive characteristics and having capacitively reactive characteristics over said frequency range, and an inductive impedance device in series with said first impedance element; the reactance of said first impedance element and said inductive impedance device changing with a change in the frequency of oscillation in a manner such that it compensates for changes in amplitude with frequency of a signal at the base electrode to produce a signal of more constant amplitude at a point between said first impedance element and said inductive impedance device.

8. A transistor oscillator according to claim 7 wherein said first impedance element is effectively included in the transistor biasing network.

9. In a frequency converter having a transistor oscillator; a mixer diode; a transistor for said oscillator; an adjustable means connected between the collector and the emitter electrodes of the transistor to produce an oscillatory sustaining condition in a frequency range including about 250 mc. to about 1000 mc.; a transistor biasing circuit including a transistor biasing network connected to a source of direct current biasing potential and connected to the base electrode of said transistor; the improvement comprising:

a frequency sensitive voltage dividing impedance means connected to the base electrode of said transistor and to a circuit point of substantially fixed potential; said mixer diode being connected to a point on said impedance means; the reactance of said impedance means changing with a changing frequency of oscillation so as to produce simultaneously a signal at the base electrode having an amplitude changing with frequency and a signal at said point on said impedance means having a relatively constant amplitude regardless of changing frequency.

10. A frequency converter according to claim 9 wherein said frequency sensitive voltage dividing impedance means is effectively included in the transistor biasing circuit.

11. A transistor oscillator comprising in combination: a transistor, an adjustable means connected between the collector and the emitter electrodes of said transistor to produce an oscillatory sustaining condition over a frequency range, frequency sensitive impedance means connected to the base electrode of said transistor for deriving an output signal therefrom and to a circuit point of substantially constant potential, and conductive means connected to said impedance means for coupling a relatively constant amplitude signal as compared to the output signal at said base electrode.

References Cited

UNITED STATES PATENTS

| | | | |
|---|---|---|---|
| 2,833,924 | 5/1958 | Tongue | 331—182 XR |
| 3,117,288 | 1/1964 | Modiano | 331—183 XR |
| 3,292,104 | 12/1966 | Kitchin | 331—109 |

KATHLEEN H. CLAFFY, *Primary Examiner.*

R. S. BELL, *Assistant Examiner.*